(12) United States Patent
Bucksch et al.

(10) Patent No.: US 7,421,629 B2
(45) Date of Patent: Sep. 2, 2008

(54) SEMI-CONDUCTOR COMPONENT TEST DEVICE, IN PARTICULAR DATA BUFFER COMPONENT WITH SEMI-CONDUCTOR COMPONENT TEST DEVICE, AS WELL AS SEMI-CONDUCTOR COMPONENT TEST PROCEDURE

(75) Inventors: Thorsten Bucksch, München (DE); Martin Meier, München (DE)

(73) Assignee: Infineon Technologies AG, Munich (DE)

( * ) Notice: Subject to any disclaimer, the term of this patent is extended or adjusted under 35 U.S.C. 154(b) by 181 days.

(21) Appl. No.: 11/253,814

(22) Filed: Oct. 20, 2005

(65) Prior Publication Data

US 2006/0107155 A1    May 18, 2006

(30) Foreign Application Priority Data

Oct. 21, 2004    (DE)    ........................ 10 2004 051 346

(51) Int. Cl.
  *G11C 29/00*    (2006.01)
(52) U.S. Cl. .................... 714/718; 714/30; 714/702; 714/720; 714/728; 714/733; 714/734; 714/738; 714/739; 714/742; 714/743; 711/100; 711/200; 365/201
(58) Field of Classification Search ........................ None
  See application file for complete search history.

(56) References Cited

U.S. PATENT DOCUMENTS

| 5,138,619 | A | * | 8/1992 | Fasang et al. ................ 714/718 |
| 5,258,986 | A | * | 11/1993 | Zerbe .......................... 714/719 |
| 5,617,531 | A | * | 4/1997 | Crouch et al. ................. 714/30 |
| 5,668,819 | A | * | 9/1997 | Fukushima .................. 714/736 |
| 6,006,345 | A | * | 12/1999 | Berry, Jr. ..................... 714/718 |
| 6,137,734 | A | * | 10/2000 | Schoner et al. ............. 365/194 |
| 6,668,347 | B1 | * | 12/2003 | Babella et al. .............. 714/733 |
| 6,769,081 | B1 | * | 7/2004 | Parulkar ..................... 714/733 |
| 6,769,084 | B2 | * | 7/2004 | Kim et al. ................... 714/739 |
| 6,834,361 | B2 | * | 12/2004 | Abbott ........................ 714/42 |
| 6,966,017 | B2 | * | 11/2005 | Evans .......................... 714/718 |
| 7,072,923 | B2 | * | 7/2006 | Duncan ........................ 708/250 |
| 2002/0184578 | A1 | * | 12/2002 | Yoshizawa ................... 714/718 |
| 2002/0194557 | A1 | * | 12/2002 | Park ........................... 714/718 |
| 2004/0030970 | A1 | * | 2/2004 | Chen et al. .................. 714/718 |
| 2005/0138267 | A1 | * | 6/2005 | Bains et al. ................. 711/100 |
| 2006/0085710 | A1 | * | 4/2006 | Spica et al. ................. 714/728 |

FOREIGN PATENT DOCUMENTS

| DE | 68923531 T2 | 4/1996 |
| EP | 1241678 A2 | 9/2002 |

* cited by examiner

*Primary Examiner*—John P Trimmings
(74) *Attorney, Agent, or Firm*—Slater & Matsil, L.L.P.

(57) ABSTRACT

The invention relates to a semi-conductor component test procedure, and a semiconductor component test device (10b), which comprise:
  a device (43) for generating pseudo-random address values to be applied to corresponding address inputs of a semi-conductor component (2b), in particular a memory component, to be tested.

16 Claims, 4 Drawing Sheets

SEMI-CONDUCTOR COMPONENT TEST DEVICE, IN PARTICULAR DATA BUFFER COMPONENT WITH SEMI-CONDUCTOR COMPONENT TEST DEVICE, AS WELL AS SEMI-CONDUCTOR COMPONENT TEST PROCEDURE

CLAIM FOR PRIORITY

This application claims the benefit of priority to German Application No. 10 2004 051 346.5, filed in the German language on Oct. 21, 2004, the contents of which are hereby incorporated by reference.

TECHNICAL FIELD OF THE INVENTION

The invention relates to a semi-conductor component test device, in particular a data buffer component with a device of this nature, as well as a semi-conductor component test procedure.

BACKGROUND OF THE INVENTION

Semi-conductor components, e.g. corresponding integrated (analog and/or digital) computer circuits, semi-conductor memory components such as functional memory components (PLAs, PALs, etc.) and table memory components (e.g. ROMs or RAMs, particularly SRAMs and DRAMs) etc. are subjected to numerous tests during the course of the manufacturing process.

For the simultaneous manufacture of a plurality of (generally identical) semi-conductor components, a so-called wafer (i.e. a thin disk consisting of monocrystalline silicon) is used. The wafer is appropriately processed (e.g. subjected to numerous coating, exposure, etching, diffusion and implantation process steps, etc.), and subsequently sawn up (or e.g. scored and snapped off), so that the individual components become available.

During the manufacture of semi-conductor components (e.g. DRAMs (Dynamic Random Access Memories and/or dynamic Read/Write memories), particularly of DDR-DRAMs (Double data Rate—DRAMs and/or DRAMs with double data rate)) the components (still on the wafer and incomplete) may be subjected to appropriate test procedures at one or several test stations by means of one or several test apparatuses (e.g. so-called kerf measurements at the scoring grid) even before all the required above processing steps have been performed on the wafer (i.e. even while the semi-conductor components are still semi-complete).

After the semi-conductor components have been completed (i.e. after all the above wafer processing steps have been performed) the semi-conductor components are subjected to further test procedures at one or several (further) test stations; for instance the components—still present on the wafer and completed—may be tested with the help of corresponding (further) test apparatuses ("disk tests").

In corresponding fashion one or more further tests may be performed (at further corresponding test stations and by using corresponding further test equipment) e.g. after the semi-conductor components have been installed in corresponding semi-conductor-component housings, and/or e.g. after the semi-conductor component housings (together with the semi-conductor components installed in them) have been installed in corresponding electronic modules (so-called "module tests").

During the testing of semi-conductor components (e.g. during the above disk tests, module tests, etc.), so-called "DC tests" and/or e.g. so-called "AC tests" may in each case be applied as test procedures.

During a DC test for instance a voltage (or current) at a specific—in particular a constant—level may be applied to a corresponding connection of a semi-conductor component to be tested, whereafter the level of the—resulting—currents (and/or voltages) are measured—in particular tested to see whether these currents (and/or voltages) fall within predetermined required critical values.

During an AC test in contrast, voltages (or currents)—at varying levels—can for instance be applied to the corresponding connections of a semi-conductor component, particularly corresponding test sample signals, with the help of which appropriate function tests may be performed on the semi-conductor component in question.

With the aid of above test procedures defective semi-conductor components and/or modules may be identified and then removed (or else partially repaired as well as), and/or the process parameters—applied during the manufacture of the components in each case—may be appropriately modified and/or optimized, in accordance with the test results achieved, etc., etc.

In a plurality of applications—e.g. in server or workstation computers, etc., etc.—memory modules with data buffer components (so-called buffers) connected in series before them, e.g. so-called "buffered DIMMS", may be used.

Memory modules of this nature generally contain one or several semi-conductor memory components, in particular DRAMs, as well as one or several data buffer components—connected in series before the semi-conductor memory components—(which may for instance be installed on the same printed circuit board as the DRAMs).

The memory modules are connected—in particular with a corresponding memory controller connected in series before them (for instance arranged externally to the memory module in question)—with one or several micro-processors of a particular server or work station computer, etc.

In "partially" buffered memory modules, the address and control signals—e.g. those emitted by the memory controller, or by the processor in question—may be (briefly) retained by corresponding data buffer components and then relayed—in chronologically co-ordinated, or where appropriate, in multiplexed or demultiplexed fashion—to the memory components, e.g. DRAMs.

In contrast, the (useful) data signals—emitted by the memory controller and/or by the respective processor—may be relayed directly—i.e. without being buffered by a corresponding data buffer component (buffer)—to the memory components (and—conversely—the (useful) data signals emitted by the memory components may be directly relayed to the memory controller and/or the respective processor).

In "fully buffered" memory modules in contrast, the address and control signals exchanged between the memory controller (and/or the respective processor), and the memory components, and also the corresponding (useful) data signals can first be buffered by corresponding data buffer components, and only then relayed to the memory components and/or the memory controller (or to the respective processor).

If the above memory module is subjected to an appropriate module test (for instance for testing the soldered joints and conductive tracks on the memory module, for instance the conductive tracks between the memory components/data buffer components) corresponding MBIST (MBIST=Memory Built In Self Test) devices can be provided on the data buffer components, and corresponding LFSR (LFSR=Linear Feedback Shift registers) devices.

In order to perform a corresponding module test, appropriate pseudo-random test (useful) data signals can be accordingly generated by the LFSR devices and relayed via corresponding data lines to the memory components, so that corresponding quasi-random test (useful) data is stored in the memory components.

The (test) address and (test) control signals required in order to perform the corresponding module tests can be generated by the above MBIST devices and relayed via corresponding address and control lines to the memory components.

The above procedure (in particular the use of pseudo-random test data signals generated by the LFSR devices) has the effect that—in contrast to the (test) address and (test) control signals present on the address and control lines—a relatively large number of differing frequency segments occurs in the test (useful) data signals present on the data lines, and/or that the test (useful) data signals consist of a relatively broad band of mixed frequencies.

SUMMARY OF THE INVENTION

The invention is aimed at making available a novel semi-conductor component test device, in particular a novel data buffer component with a device of this nature, as well as a novel semi-conductor component test procedure.

It achieves these and further aims by means of the subject matters of claims 1 and 9.

Advantageous further developments of the invention are listed in the subsidiary claims.

In terms of a first aspect of the invention, a semi-conductor component test device is made available, which comprises:

a device for generating pseudo-random address values to be applied to corresponding address inputs of a semi-conductor component, in particular a memory component, to be tested.

In addition—in terms of a second aspect of the invention—a semi-conductor component test-procedure is made available, whereby the procedure comprises the steps:

(a) Generating a pseudo-random value, and (b) applying the pseudo-random value to corresponding address inputs of a semi-conductor component to be tested.

The use of pseudo-random (test) address values (instead of test-address values generated in the conventional manner) may inter alia have the advantage that during the performance of a corresponding test, a relatively large number of different frequency segments may occur in the signals then present on corresponding address lines (and/or that the corresponding test address signals (and not for instance just corresponding test (useful) data signals) may consist of a relatively broad-band frequency mix).

Below the invention is more closely described by means of an embodiment example and the attached illustration. In the illustration:

DETAILED DESCRIPTION OF THE INVENTION

Figure 1:
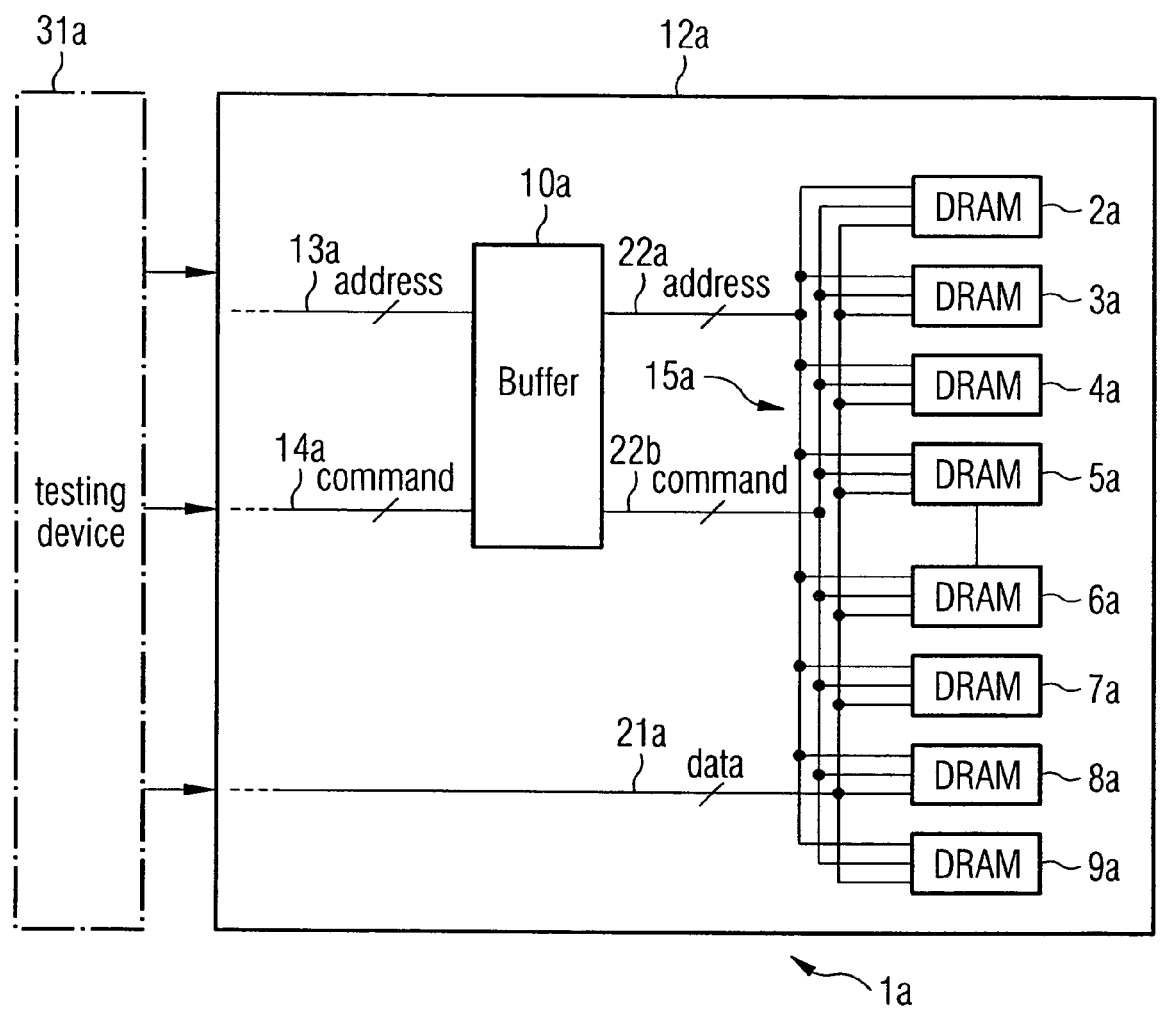
FIG. 1 shows a schematic representation of a partially buffered memory module, with corresponding memory components and corresponding data buffer components.

In FIG. 1 a schematic representation of a "partially" buffered memory module $1a$ (here: a "buffered DIMM" $1a$) is shown.

It contains a plurality of memory components $2a$, $3a$, $4a$, $5a$, $6a$, $7a$, $8a$, $9a$, and—connected in series before the memory components $2a$, $3a$, $4a$, $5a$, $6a$, $7a$, $8a$, $9a$—one or more data buffer components ("buffers") $10a$.

The memory components $2a$, $3a$, $4a$, $5a$, $6a$, $7a$, $8a$, $9a$ may for instance be function storage or table memory components (e.g. ROMs or RAMs), particularly DRAMs.

As is apparent from FIG. 1, the memory components $2a$, $3a$, $4a$, $5a$, $6a$, $7a$, $8a$, $9a$ may be arranged on the same printed circuit board $12a$ as the buffer $10a$.

The memory module $1a$ may be connected—particularly with a corresponding memory controller connected in series before it (e.g. one installed externally to the memory module $1a$, in particular one installed externally to the above printed circuit board $12a$ and not shown here)—with one or several micro-processors, particularly with one or several micro-processors of a server or work station computer (or of any other suitable micro-processor, e.g. a PC, laptop, etc.).

As is apparent with the partially buffered memory module $1a$ shown in FIG. 1, the address—and control—signals, for instance those emitted by the memory controller or the processor in question, are not directly relayed to the memory components $2a$, $3a$, $4a$, $5a$, $6a$, $7a$, $8a$, $9a$.

Instead of this, the address signals—for instance via a corresponding address bus $13a$ (and/or corresponding address lines)—and the control signals—for instance via a corresponding control bus $14a$ (and/or corresponding control lines)—are first led to the buffers $10a$.

The control signals may be any suitable control signals as used in conventional memory modules, e.g. corresponding read and/or write, and/or chip-select (memory component selection) signals, etc., etc.

In the buffers $10a$ the corresponding signals (address signals, control signals) are—briefly—buffered, and relayed—in a chronologically co-ordinated, or where needed, in multiplexed or demultiplexed fashion—to the memory components $2a$, $3a$, $4a$, $5a$, $6a$, $7a$, $8a$, $9a$ (e.g. via a corresponding—central—memory bus $15a$ (with corresponding address line $22a$ and control line $22b$)).

With the partially buffered memory module $1a$ shown in FIG. 1 in contrast, the (useful) data signals—e.g. those emitted by the above memory controller or by the relevant processor—may be directly, i.e. without being buffered by a corresponding data buffer component (buffer) relayed to the memory components $2a$, $3a$, $4a$, $5a$, $6a$, $7a$, $8a$, $9a$ (e.g. via a (useful) data bus $21a$, which is directly connected with the above central memory bus $15a$).

Correspondingly inverted, the (useful) data signals—emitted by the memory components $2a$, $3a$, $4a$, $5a$, $6a$, $7a$, $8a$, $9a$—can also be directly—without the inter-connection of a corresponding data buffer component (buffer)—relayed to the memory controller and/or to the relevant processor (e.g. again via the above (useful) data bus $21a$, which is directly connected with the central memory bus $15a$).

Figure 2:
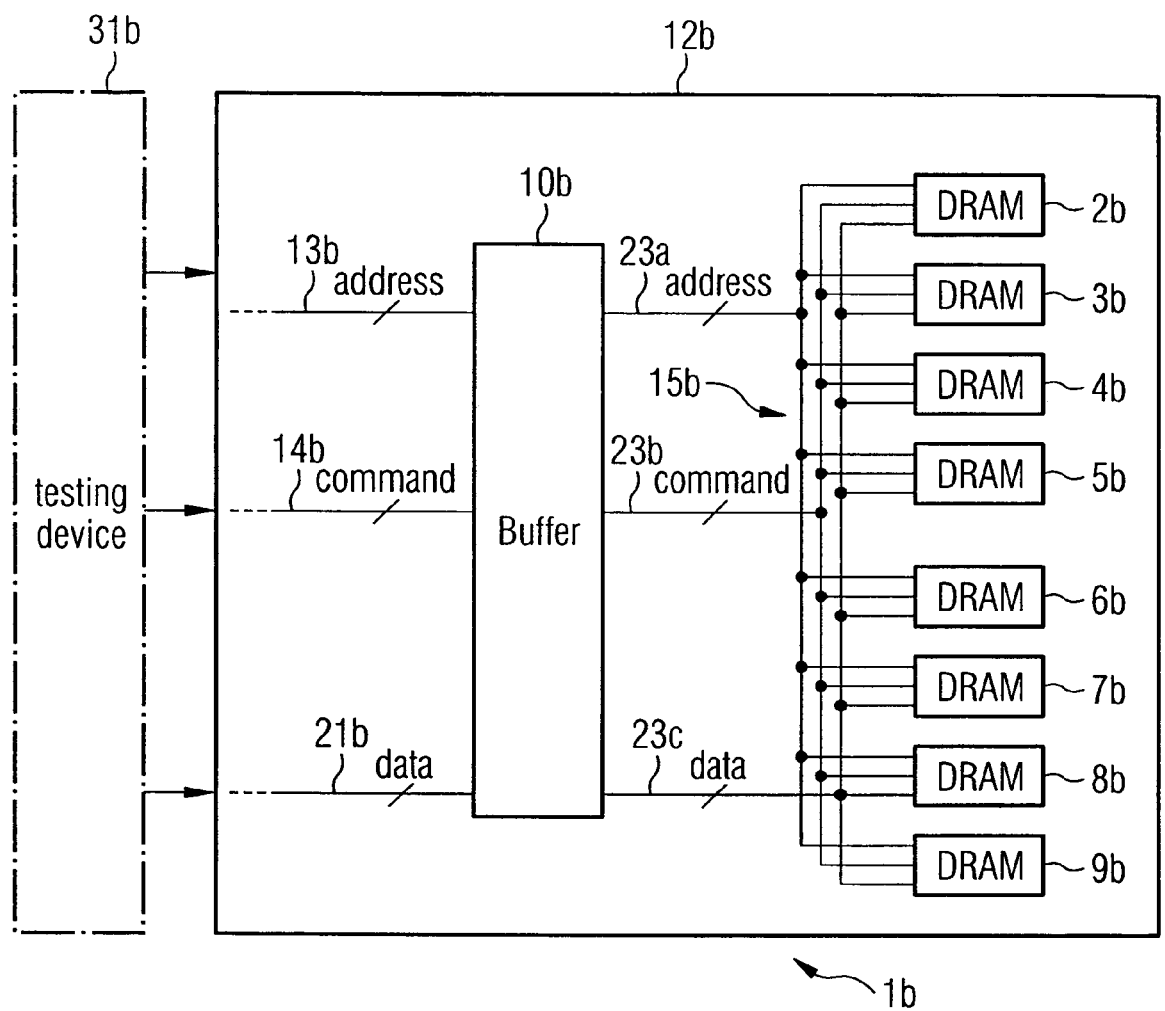
FIG. 2 shows a schematic representation of a fully buffered memory module, with corresponding memory components and corresponding data buffer components.

In FIG. 2 a schematic representation of a fully buffered memory module $1b$ (here: a "buffered DIMM" $1b$) is shown.

This contains—corresponding with the partially buffered memory module 1a according to FIG. 1—a plurality of memory components 2b, 3b, 4b, 5b, 6b, 7b, 8b, 9b and one or more data buffer components ("buffers") 10b connected in series before the memory components 2b, 3b, 4b, 5b, 6b, 7b, 8b, 9b.

As is apparent from FIG. 2, the memory components 2b, 3b, 4b, 5b, 6b, 7b, 8b, 9b can be arranged on the same printed circuit board 12b as the buffers 10b.

The memory module 1b can (correspondingly similar to the memory module 1a shown in FIG. 1)—in particular with an inter-connected corresponding memory controller (not shown here and e.g. arranged externally to the memory module 1b, in particular arranged externally to the above printed circuit board 12)—be connected with one or several micro-processors, particularly with one or several micro-processors of a server or workstation computer (or any other suitable micro-processor, e.g. a PC, laptop, etc.).

As is apparent from FIGS. 1 and 2, the memory module 1b shown in FIG. 2 is correspondingly similarly and/or identically constructed and operates similarly or identically to the memory module 1a shown in FIG. 1, except that with buffer 10b—correspondingly similar to conventional "fully buffered" memory modules—(in addition to the correspondingly similarly buffered control and address signals as shown in FIG. 1 in relation to the memory module 12a) the (useful) data signals exchanged between the memory controller, and/or each processor, and the memory components 2b, 3b, 4b, 5b, 6b, 7b, 8b, 9b, are also buffered. As in FIG. 1, the address signals—for instance via a corresponding address bus 13b (and/or corresponding address lines)—and the control signals—for instance via a corresponding control bus 14b (and/or corresponding control lines)—are first led to the buffer 10b.

In buffer 10b the corresponding data signals, e.g. those deriving from the memory controller, and/or from the respective processor, e.g. relayed via a data bus 21b, may be—briefly—buffered and—in a chronologically co-ordinated, or where appropriate, in a multiplexed or de-multiplexed fashion—relayed to the memory components 2b, 3b, 4b, 5b, 6b, 7b, 8b, 9b (e.g. via a—central—memory bus 15b (corresponding with the above central bus 15a) with corresponding address, control and data lines 23a, 23b, 23c)).

Correspondingly inverted, the data signals emitted by the memory components 2b, 3b, 4b, 5b, 6b, 7b, 8b, 9b to the above central memory bus 15b, can also be—briefly—buffered in buffer 10b and relayed—in a chronologically co-ordinated, or where appropriate, in a multiplexed or de-multiplexed fashion—to the memory controller and/or the relevant processor (e.g. via the above data bus 21b).

Figure 3:
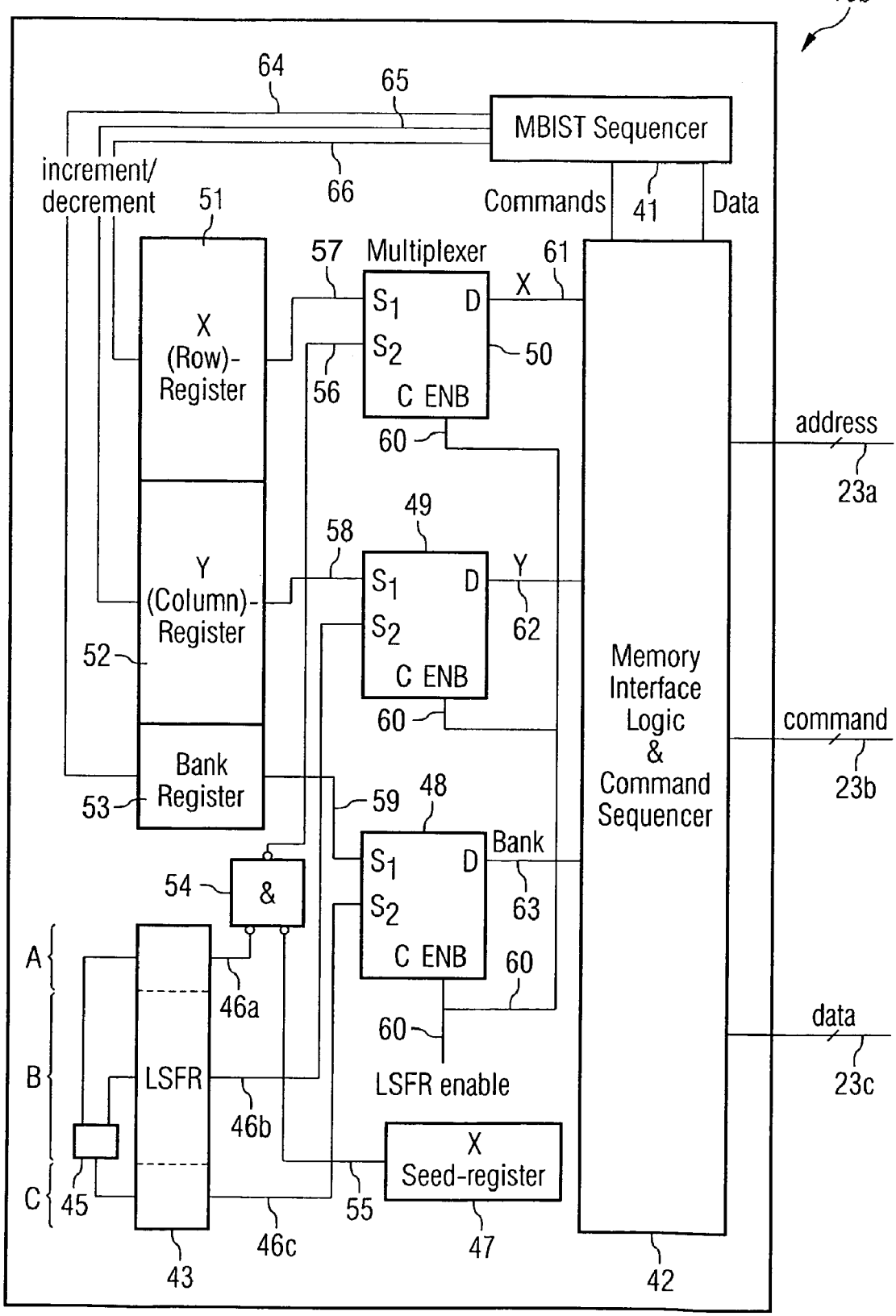
FIG. 3 shows, as an example, a schematic detailed representation of a section of a data buffer component used in the memory module in terms of FIG. 2, which component can be used to perform a semi-conductor component test procedure in terms of an embodiment example of the invention.

FIG. 3 shows—as an example—a schematic detail representation of a section of a data buffer component and/or buffer 10b used with the memory module 1b according to FIG. 2 (and in a correspondingly similar embodiment also able to be used in the memory module 1a shown in FIG. 1).

As is apparent from FIG. 3, the buffer 10b correspondingly similar to conventional data buffer components contains a MBIST device 41 (MBIST=Memory Built-In Self Test, and/or integral memory testing device) and a memory interface logic device 42 for performing corresponding module tests.

The memory interface logic device 42 is connected with the above memory bus 15b (in particular with the above address, control and data lines 23a, 23b, 23c), and can therefor also—for test purposes—apply corresponding address, control and (useful) data signals to the memory components 2b, 3b, 4b, 5b, 6b, 7b, 8b, 9b.

If corresponding pseudo-random test (useful) data signals are used as test (useful) data signals, an LFSR (LFSR=Linear Feedback Shift Register, not shown here) can—corresponding with conventional data buffering components—be provided in the MBIST device 41. The pseudo-random test (useful) data signals generated by the LFSR can—via the above data lines 23c, and with memory interface logic device 42 connected in series before it—be relayed to the memory components 2b, 3b, 4b, 5b, 6b, 7b, 8b, 9b and be stored there as corresponding quasi-random test (useful) data.

This has the advantage that, during the execution of a corresponding module test, a relatively large number of differing frequency components occurs in the test (useful) data signals present on the corresponding data lines 23c and/or that the test (useful) data signals consist of a relatively broad-band mix of frequencies.

In the present embodiment example—as is more closely described below—an identical and/or similar effect can (alternatively or additionally) inter alia also be achieved during the execution of a corresponding module test for the test address signals relayed via the above address lines 23a (also with the memory interface logic device 42 connected in series before it) to the memory components 2b, 3b, 4b, 5b, 6b, 7b, 8b, 9b:

For this—as shown in FIG. 3—an LFSR device 43 (LFSR=Linear Feedback Shift Register) generating appropriate quasi-random address data and/or pseudo-random address data is provided (which can be correspondingly similarly constructed to conventional LFSRs—used for generating quasi-random test (useful) data—(for instance correspondingly similar to the LFSR provided in the above MBIST device 41 provided where necessary)).

Figure 4:
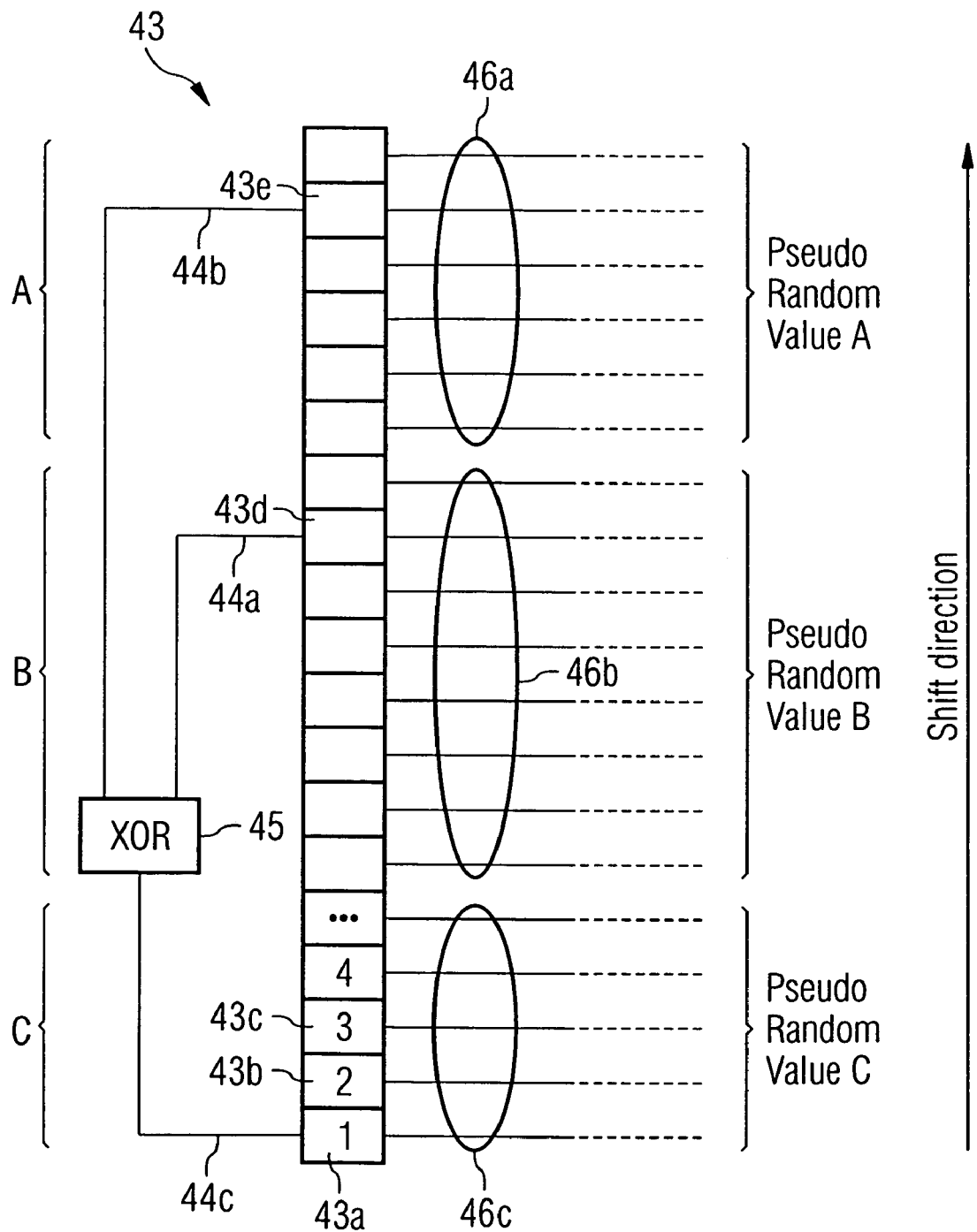
FIG. 4 shows, as an example, a schematic detailed representation of the LFSR device illustrated in FIG. 3.

As is apparent from FIG. 4, the LFSR device 43 contains several series-connected memory devices 43a, 43b, 43c, 43d, 43e, creating a memory device chain (e.g. more than ten or twenty, here e.g. 32 series-connected memory devices), in which a corresponding binary number ("logic one", or "logic zero") can be stored.

One memory device 43d of the memory devices 43a, 43b, 43c, 43d, 43e—lying relatively far "back" in the above memory device chain—is connected via a line 44a with a first input of an XOR member (Exclusive OR member) 45, and a memory device 43e of the memory devices 43a, 43b, 43c, 43d, 43e—lying even further "back" in the above memory device chain in relation to the memory device 43d—is connected via a line 44b with a second input of the XOR member 45.

In the case of the LFSR device 43, correspondingly similar to conventional LFSRs, the binary number, which is in each case stored in one particular memory device of the series-connected memory devices 43a, 43b, 43c, 43d, 43e, is in each step written into the next memory device 43d lying one step "back" in the memory device chain, and the binary number emitted by the XOR member 45 via a line 44c is written into the (first) memory device 43a.

A first pseudo-random value A can thereby be tapped at several lines 46a connected with a first group A of memory devices, a second pseudo-random value B can be tapped at lines 46b connected with a second group B of memory devices, and a third pseudo-random value C at lines 46b connected with a third group C of memory devices.

The pseudo-random value A that can be tapped at 46a can exhibit a bandwidth which corresponds with the row-address width of the above memory components 2b, 3b, 4b, 5b, 6b, 7b, 8b, 9b. In correspondingly similar fashion the pseudo-random value B that can be tapped at lines 46b can exhibit a width which corresponds with the column address width of the above memory components 2b, 3b, 4b, 5b, 6b, 7b, 8b, 9b, and the pseudo-random value C that can be tapped at lines 46c a width which corresponds with the bank address width of the above memory components 2b, 3b, 4b, 5b, 6b, 7b, 8b, 9b.

The pseudo-random value A that can be tapped at lines 46a can—as is more clearly illustrated below—be used for controlling corresponding row-address lines of the above address lines 23a of the memory bus 15b.

Correspondingly, the pseudo-random value B that can be tapped at the lines 46b can—as is more clearly illustrated below—be used for controlling corresponding column address lines of the above address lines 23a of the memory bus 15b.

In similar fashion—as is more clearly illustrated below—the pseudo-random value B that can be tapped at lines 46c, can used for controlling corresponding bank address lines of the above address lines 23a of the memory bus 15b.

As is further apparent from FIG. 3, the data buffer component 10b contains a further register 47, as well as several multiplexers 48, 49, 50, an AND member 54 and—correspondingly similar to conventional data buffer components—a row register 51, a column register 52, and a bank register 53.

In terms of FIG. 3 the lines 46a are connected with corresponding—first—inputs of the AND member 54, and corresponding register output lines 55 of the additional register 47 connected with corresponding—second—inputs of the AND member 54.

The number of register output lines 55 can be the same as the number of lines 46a (corresponding for instance with the row address width of the above memory components 2b, 3b, 4b, 5b, 6b, 7b, 8b, 9b).

If—in a first operating mode of the data buffer component 10b—only binary "ones" are stored in the additional register, "high logic" signals will in each case be present on all lines of the register output lines 55 of the additional register 47.

This has the effect that signals present on lines 46a (i.e. the above first pseudo-random value A) are relayed—essentially unchanged—to corresponding lines 56 connected with corresponding outputs of the AND member 54.

If on the contrary—in a second operating mode of the data buffer components 10b—only binary "zeros" are stored in the additional register, "low logic" signals will in each case be present on all lines of the register output lines 55 of the further register 47.

This has the effect that signals present on lines 46a (i.e. the above first pseudo-random value A) are not relayed to the corresponding lines 56 connected with corresponding outputs of the AND member 54; instead of this only "low logic" signals will then in each case be present there.

As is further apparent from FIG. 3, the lines 56 connected with the above outputs of the AND member 54 are connected with corresponding—second—inputs (S2) of the multiplexer 50.

In addition the lines 57 connected with corresponding outputs of the row register 51 are connected with corresponding—first—inputs (S1) of the multiplexers 50.

The number of lines 57 can be the same as the number of lines 56 (and thereby for instance the same as the number of lines 46a, and/or 55 (for instance corresponding with the row address width of the above memory components 2b, 3b, 4b, 5b, 6b, 7b, 8b, 9b)).

As shown in Figure, the above lines 46b (via which the above second pseudo-random value B can be relayed) are connected with corresponding—second—inputs (S2) of the multiplexer 49.

In addition the lines 58 connected with corresponding outputs of the column registers 52 are connected with corresponding—first—inputs (S1) of the multiplexer 49.

The number of lines 58 can be the same as the number of lines 46b (for instance corresponding with the column address width of the above memory components 2b, 3b, 4b, 5b, 6b, 7b, 8b, 9b).

As is further apparent from FIG. 3, the above lines 46c (with which the above third pseudo-random value C can be relayed) are connected with corresponding—second—inputs (S2) of the multiplexer 48.

In addition lines 59 connected with corresponding outputs of the bank register 53 are connected with corresponding—first—inputs (S1) of the multiplexer 48.

The number of lines 59 can be the same as the number of lines 46c (for instance corresponding with the bank address width of the above memory components 2b, 3b, 4b, 5b, 6b, 7b, 8b, 9b).

In the above first (and second) operating mode of the data buffer component 10b—more closely illustrated below—a "high logic" enabling signal (LFSR enable) can be applied to corresponding LFSR enabling lines 60, or alternatively a "low logic" signal (in particular in a third operating mode—more closely described below—of the data buffer components 10b).

The enabling lines 60 are connected with corresponding control inputs of the multiplexers 48, 49, 50.

If—in the above first and second operating mode of the data buffer component 10b—a "high logic" enabling signal is present on the LFSR enabling lines 60, the signals present on lines 56, 46b, 46c connected with each "second" input (S2) of the multiplexer 48, 49, 50 (i.e. for instance—in the first operating mode—the above first pseudo-random value A (or alternatively—in the second operating mode—the value "0"), the above second pseudo-random value B, and the above third pseudo-random value C) are relayed—essentially unchanged—to lines 61, 62, 63 connected with corresponding outputs of the multiplexer 48, 49, 50 (and thereby correspondingly also—as is more clearly illustrated below—to corresponding row-address, column address and bank address lines of the above address lines 23a).

If by contrast—for instance in the above third operating mode of the data buffer component 10b—a "low logic" signal is present on LFSR enabling lines 60, instead of this the signals (i.e. the particular values determined by control signals relayed by the MBIST device 41 by means of corresponding lines 64, 65, 66 to the corresponding register 51, 52, 53, and stored in the row register 51, and/or in the column register 52, and/or in the bank register 53) present on the lines 57, 58, 59 connected in each case with "first" inputs (S1) of the multiplexer 48, 49, 50—are relayed essentially unchanged—to the above lines 61, 62, 63, connected with corresponding outputs of the multiplexer 48, 49, 50 (and thereby correspondingly also—as described below—to corresponding row address, column address and bank address lines of the above address lines 23a).

In the above first operating mode of the data buffer components 10b, as is apparent from the above descriptions, corresponding pseudo-random test address signals—produced by the LFSR device 43—are therefore present on the row address as well as on the column address and bank address lines of the above address lines 23a (namely the above first pseudo-random value A on the row address lines of the above address lines 23a, the above second pseudo-random value B on the column address lines of the above address lines 23a, and the above third pseudo-random value C on the bank address lines of the above address lines 23a).

In the above second operating mode of the data buffer components 10b in contrast, corresponding pseudo-random test address signals—produced by the LFSR device 43—only are present on the column address and bank address lines of the above address lines 23a (namely the above second pseudo-random value B on the column address lines of the above address lines 23a, and the above third pseudo-random value C on the bank address lines of the above address lines 23a), whereas a continuous constant value (here: "0") is present on the row address lines of the above address lines 23a—as a result of the "blocking" of the signals present on lines 46a (by means of the "low logic" signal present on the register output lines 55).

The above procedure has the advantage that, during the execution of a corresponding module test (triggered and/or centrally controlled by an external test apparatus 31a, 31b (for instance a corresponding ATE tester (ATE =Automated Test Equipment) correspondingly controlling the data buffer component 10b, in particular for instance the above LFSR enabling signal, and/or the further register 47, and/or the MBIST device 41))—in the above first and second operating mode a relatively large number of differing frequency segments occur in the test address signals present on the corresponding address lines 23a (in particular, signals present on the row, column and bank address lines when in the first operating mode, and on the column and bank address lines when in the second operating mode) and/or that the corresponding test address signals consist of a relatively broad-band frequency mix.

In contrast to this—as is also apparent from the above descriptions—in the above third operating mode of the data buffer component 10b, instead of the (pseudo-random) values supplied by the LFSR device 43 (and/or by the further register 47), the values supplied by the above row register 51 and/or the column register 52 and/or the bank register 53 are present at the row address, column address and bank address lines of the above address lines 23a (namely the value supplied by the row register 51 to the row address lines of the above address lines 23a; the value supplied by the column register to the column address lines of the above address lines 23a, and the value supplied by the bank register to the bank address lines—i.e. no pseudo-random values, but values supplied in the conventional way by the MBIST device 41 (for instance in each case (address) values correspondingly stepwise increased and/or incremented, or decreased and/or decremented)).

In accordance with conventional data buffer components, it is also ensured by means of the MBIST device 41 and/or the memory interface logic device 42 that, at the data buffer component 10b, the address signals emitted to the address lines 23a (corresponding with signals present on lines 61, 62, 63) are emitted in chronologically correct co-ordination, concurrently with and/or leading/trailing corresponding test (useful) data and test control signals (controlled by the MBIST device 41, and/or the memory interface logic device 42) emitted to the data lines 23c and the control lines 23b:

First, for instance with the help of a word line activation command (activate command (ACT)) emitted to the control lines 23b, a corresponding word line—defined by the above row address (or where required, pseudo-random row address)—of a sub-array ("bank") of a corresponding memory component 2b, 3b, 4b, 5b, 6b, 7b, 8b, 9b), defined by the above bank address (or where required, pseudo-random bank address) emitted to the above address lines 23a—is activated.

Then—with the help of a corresponding read or write command (Read (RD) and/or write (WT) command emitted to the control lines 23b)—the effect is achieved, that the data—at that point accurately specified by the above corresponding column address (or where required, pseudo-random column address) emitted to the address lines 23a—is emitted by the corresponding memory components 2b, 3b, 4b, 5b, 6b, 7b, 8b, 9b (or is read into them).

The word line in question is left in an activated state for the time being.

Then if—what is in statistical terms a relatively common occurrence during the normal operation of the memory module 1a, 1b—the already activated word line at the corresponding sub-array ("bank") is accessed again, the emission of another word line activation command (ACT command) can be dispensed with (case A).

Instead of this, a corresponding read (or write) command (RD (or WT) command) can immediately be emitted to the control lines 23b (and a (new) column address (or where appropriate a pseudo-random column address) to the address lines 23a, which address accurately specifies the data in question)).

Only then, when—what is a statistically less common occurrence in the normal operation of the memory module 1a, 1b—a word line different to the one that was last activated at the corresponding sub array ("memory bank") is accessed, the corresponding word line—used last—is deactivated by means of a corresponding word line deactivation command (PRE command) emitted to the control lines 23b, whereupon the—new—word line is activated (by the emission of a corresponding further word line activation command (ACT command) to the control lines 23b) (case B).

The above case A—which in statistical terms occurs relatively frequently during the normal operation of the memory module 1a, 1b—of a word line, which is left (for the time being) in an active state (with relatively rapid address changes, in particular column address changes, occurring on the address lines 23a for the above reasons) can be particularly well simulated and tested with the help of the above second operating mode (because, as already described, in each case one and the same row address is used there, i.e. the respective word line(s) is/are kept in a state of constant activation).

Devices/multiplexers correspondingly similarly or identically constructed and/or arranged and/or connected and/or operating to the above MBIST device 41, and/or the memory interface logic device 42, and/or the multiplexer 50, 49, 48, and/or the register 51, 52, 53, and/or the LFSR device 43, etc. (in particular generating/using corresponding pseudo-random address signals) can, instead of being provided on the above buffer, for instance also be provided on the above test apparatus 31a, 31b (or on any other—external—test apparatus) and/or on the above memory component 2a, 2b itself (or on any suitable semi-conductor, in particular any memory component), etc.

The invention claimed is:

1. A semi-conductor memory component test device comprising a data buffer component, the data buffer component comprising:
   a plurality of first devices for storing and chronologically transferring row, column and bank address values;
   a second device for generating pseudo-random row, column and bank address values to be applied to corresponding address inputs of a semi-conductor component; and
   a plurality of third devices for selecting between outputs from the plurality of first devices and outputs from the second device, wherein the data buffer component operates in at least one mode wherein the pseudo-random values corresponding to the column and bank addresses are selected, while the pseudo-random values corresponding to the row addresses are set to a "0" level.

2. The semi-conductor memory component test device of claim 1, wherein the second device comprises a shift register, in particular a back-connected shift register.

3. The semi-conductor memory component test device of claim 1, further comprising:
   a seed register that outputs a first value or a second value; and
   a selector device comprising a first and second inputs and an output, the first input connected to the outputs of the second device, and the second input connected to the outputs of the seed register, wherein the output of the selector device comprises the row address values generated by the second device if the second input is at the first value, and wherein the output of the selector device comprises the second value if the second input is at the second value.

4. The semi-conductor memory component test device of claim 3, wherein the selector device comprises an AND gate.

5. The semi-conductor memory component test device of claim 4, wherein the plurality of third devices utilize an input from an enable signal in selecting between the outputs from the plurality of first devices and the outputs from the second device.

6. The semi-conductor memory component test device of claim 5, wherein the plurality of third devices comprise multiplexers.

7. A memory module, with at least one memory component, and the semi-conductor memory component test device of claim 1.

8. The memory module of claim 7, wherein the data buffer component buffers data, control and address signals.

9. The memory module of claim 7, wherein the data buffer component buffers control and address signals, wherein data signals are directly connected to a bus of the at least one memory component.

10. A semi-conductor component test procedure, the procedure comprising:
    generating test signals comprising pseudo-random row, column and bank address values using a pseudo-random generator and
    applying the generated pseudo-random values to corresponding address inputs of a semi-conductor component to be tested, wherein applying the generated pseudo-random values comprises applying the generated pseudo-random column and bank address values and combining the generated pseudo-random row address values with a value from a seed register based on a logical conjunction, wherein the semi-conductor component operates in at least one mode wherein the pseudo-random values corresponding to the column and bank addresses are selected, while the pseudo-random values corresponding to the row addresses are set to a "0"level.

11. The semi-conductor component test procedure of claim 10, wherein the generated pseudo-random row address values are replaced by an AND gate.

12. A semi-conductor memory component test device comprising a data buffer component, the data buffer component comprising:
    a plurality of first devices for storing and chronologically transferring row, column and bank address values;
    a second device for generating pseudo-random row, column and bank address values to be applied to corresponding address inputs of a semi-conductor component;
    a plurality of third devices comprising multiplexers for selecting between outputs from the plurality of first devices and outputs from the second device, wherein the plurality of third devices utilize an input from an enable signal in selecting between the outputs from the plurality of first devices and the outputs from the second device;
    a seed register that outputs a first value or a second value; and
    an AND gate comprising a first and second inputs and an output, the first input connected to the outputs of the second device, and the second input connected to the outputs of the seed register, wherein the output of the selector device comprises the row address values generated by the second device, wherein the data buffer component operates in at least three modes, the modes comprising:
    a first mode, wherein the row, column and bank address values are determined by the plurality of first devices;
    a second mode, wherein the pseudo-random values corresponding to the row, column and bank addresses are selected; and
    a third mode, wherein the pseudo-random values corresponding to the column and bank addresses are selected, while the pseudo-random values corresponding to the row addresses are set to a "0"level.

13. A semi-conductor component test device comprising a data buffer, the data buffer comprising:
    a row register having an output;
    a column register having an output;
    a bank register having an output;
    a linear feedback shift register with outputs for generating pseudo-random row, column and bank address values; and
    a plurality of multiplexers for selecting either the outputs from the row, column and bank registers or corresponding outputs from the linear feedback shift register, wherein the data buffer operates in at least three modes, the modes comprising:
    a first mode, wherein the row, column and bank address values are determined by the row, column and bank registers;
    a second mode, wherein the pseudo-random values corresponding to the row, column and bank addresses are selected; and
    a third mode, wherein the pseudo-random values corresponding to the column and bank addresses are selected, while the pseudo-random values corresponding to the row addresses are set to a "0"level.

14. The semi-conductor component test device of claim 13, wherein the row, column and bank registers contain address values relayed by a memory built-in self test device.

15. The semi-conductor component test device of claim 13, wherein the multiplexers are connected to an enable signal, wherein the enable signal enables selection of an output signal selected from either all the outputs from the row, column and bank registers or all the corresponding outputs from the linear feedback shift register.

16. A test procedure for testing a semiconductor memory component, the test procedure comprising:
    generating a first pseudo-random value and a constant value;

using the generated first pseudo-random value as a column address, and the generated constant value as a row address in a first access to the semiconductor memory component;

generating a second pseudo-random value; and using the generated second pseudo-random value as the column address and the constant value as the row address in a second access to the semiconductor memory component subsequent to the first access such that a word line activated in the first access is kept activated in the second access.

* * * * *